United States Patent
Zihir et al.

(10) Patent No.: US 10,637,160 B2
(45) Date of Patent: Apr. 28, 2020

(54) METHOD TO BUILD FAST TRANSMIT-RECEIVE SWITCHING ARCHITECTURE

(71) Applicant: Integrated Device Technology, Inc., San Jose, CA (US)

(72) Inventors: Samet Zihir, San Diego, CA (US); Tumay Kanar, San Diego, CA (US)

(73) Assignee: Integrated Device Technology, Inc., San Jose, CA (US)

( * ) Notice: Subject to any disclaimer, the term of this patent is extended or adjusted under 35 U.S.C. 154(b) by 0 days.

(21) Appl. No.: 16/131,259

(22) Filed: Sep. 14, 2018

(65) Prior Publication Data

US 2019/0089402 A1 Mar. 21, 2019

Related U.S. Application Data

(60) Provisional application No. 62/575,346, filed on Oct. 20, 2017, provisional application No. 62/559,875, (Continued)

(51) Int. Cl.
*H01Q 21/22* (2006.01)
*H01Q 21/24* (2006.01)
(Continued)

(52) U.S. Cl.
CPC ............... *H01Q 21/22* (2013.01); *H01Q 1/26* (2013.01); *H01Q 3/28* (2013.01); *H01Q 3/36* (2013.01); *H01Q 3/40* (2013.01); *H01Q 3/46* (2013.01); *H01Q 21/0025* (2013.01); *H01Q 21/065* (2013.01); *H01Q 21/067* (2013.01); *H01Q 21/205* (2013.01); *H01Q 21/24* (2013.01); *H03F 3/195* (2013.01); *H03F 3/245* (2013.01); *H03F 3/4508* (2013.01); *H03F 3/45085* (2013.01); *H04B 1/401* (2013.01);
(Continued)

(58) Field of Classification Search
CPC ................................. H04B 1/44; H04B 7/0617
See application file for complete search history.

(56) References Cited

U.S. PATENT DOCUMENTS 4,489,324 A * 12/1984 Blume ..................... H01Q 3/38
342/372
4,587,525 A * 5/1986 Parsons .................. H01Q 1/247
343/821

(Continued)

*Primary Examiner* — Hsinchun Liao
(74) *Attorney, Agent, or Firm* — Christopher P. Maiorana, PC

(57) ABSTRACT

An apparatus includes a phased array antenna panel and one or more beam former circuits. The phased array antenna panel generally comprises a plurality of antenna elements. The plurality of antenna elements are generally arranged in one or more groups. The one or more beam former circuits may be mounted on the phased array antenna panel. Each beam former circuit is generally coupled to a respective group of the antenna elements. Each beam former circuit generally comprises a plurality of transceiver channels comprising a transmit channel and a receive channel. The phased array antenna panel is generally configured to distribute a control signal to each of the beam former circuits. Each of the transceiver channels is generally configured to switch between a transmit mode and a receive mode in response to the control signal.

20 Claims, 12 Drawing Sheets

Related U.S. Application Data filed on Sep. 18, 2017, provisional application No. 62/560,173, filed on Sep. 18, 2017.

(51) Int. Cl.

| | |
|---|---|
| *H01Q 3/28* | (2006.01) |
| *H03F 3/45* | (2006.01) |
| *H04B 7/06* | (2006.01) |
| *H01Q 21/06* | (2006.01) |
| *H01Q 3/40* | (2006.01) |
| *H03F 3/195* | (2006.01) |
| *H03F 3/24* | (2006.01) |
| *H04B 1/401* | (2015.01) |
| *H01Q 3/36* | (2006.01) |
| *H04B 1/44* | (2006.01) |
| *H01Q 1/26* | (2006.01) |
| *H01Q 3/46* | (2006.01) |
| *H01Q 21/00* | (2006.01) |
| *H01Q 21/20* | (2006.01) |

(52) U.S. Cl.
CPC ............. *H04B 1/44* (2013.01); *H04B 7/0617* (2013.01); *H04B 7/0682* (2013.01); *H04B 7/0691* (2013.01); *H03F 2200/09* (2013.01); *H03F 2200/129* (2013.01); *H03F 2200/144* (2013.01); *H03F 2200/27* (2013.01); *H03F 2200/387* (2013.01); *H03F 2200/451* (2013.01); *H03F 2203/45116* (2013.01); *H03F 2203/45151* (2013.01); *H03F 2203/45302* (2013.01); *H03F 2203/45394* (2013.01); *H03F 2203/45512* (2013.01); *H03F 2203/45526* (2013.01); *H03F 2203/45528* (2013.01)

(56) References Cited

U.S. PATENT DOCUMENTS

| | | | | |
|---|---|---|---|---|
| 4,637,073 | A * | 1/1987 | Selin | G01S 7/034 330/134 |
| 5,270,667 | A * | 12/1993 | Upton | H01P 1/2007 330/277 |
| 2006/0087385 | A1* | 4/2006 | Fitzpatrick | G01S 7/026 333/117 |
| 2017/0012359 | A1* | 1/2017 | Jung | H01Q 3/30 |
| 2017/0353338 | A1* | 12/2017 | Amadjikpe | H01Q 9/0407 |
| 2018/0062274 | A1* | 3/2018 | Madsen | H01Q 3/24 |

* cited by examiner

METHOD TO BUILD FAST TRANSMIT-RECEIVE SWITCHING ARCHITECTURE

This application relates to U.S. Provisional Application No. 62/559,875, filed Sep. 18, 2017, U.S. Provisional Application No. 62/560,173, filed Sep. 18, 2017, and U.S. Provisional Application No. 62/575,346, filed Oct. 20, 2017, which are hereby incorporated by reference in their entirety.

FIELD OF THE INVENTION

The invention relates to microwave and millimeter-wave circuit design generally and, more particularly, to a method and/or apparatus for implementing a fast transmit-receive (T/R) switching architecture.

BACKGROUND

Phased array antenna panels are used to generate steerable beams that may be utilized in wireless communication systems. Phased arrays create a focused beam that can be steered very quickly to maintain a link for any on-the-move communication system. Conventional wireless communications systems can also utilize steerable beams to communicate with multiple wireless nodes by moving the beams from one wireless node to the next. A single beam may service multiple wireless nodes in a sequence and repeat the sequence periodically such that each wireless node appears to be in constant communications with the system. The beam steering is generally implemented by power amplifiers in each transmit channel of the transceiver circuitry. The power amplifiers drive respective antenna elements of the phased array antenna to produce and steer the beams.

The antenna elements of the phased array antenna also need to be connected to each receive channel of the transceiver circuitry to provide bi-directional communication. The transceiver circuitry needs to switch the antenna elements between the transmit channels and the receive channels quickly, such that each wireless node appears to be in constant communications with the system. Transmit/receive (T/R) switches are generally used to couple the transmit and receive channels to the antenna elements. The switching speed and settling time parameters of the channels are very important for low-latency specifications, such as in emerging fifth generation (5G) communications systems.

It would be desirable to implement a fast transmit-receive (T/R) switching architecture.

SUMMARY

The invention concerns an apparatus including a phased array antenna panel and one or more beam former circuits. The phased array antenna panel generally comprises a plurality of antenna elements. The plurality of antenna elements are generally arranged in one or more groups. The one or more beam former circuits may be mounted on the phased array antenna panel. Each beam former circuit is generally coupled to a respective group of the antenna elements. Each beam former circuit generally comprises a plurality of transceiver channels comprising a transmit channel and a receive channel. The phased array antenna panel is generally configured to distribute a control signal to each of the beam former circuits. Each of the transceiver channels is generally configured to switch between a transmit mode and a receive mode in response to the control signal.

BRIEF DESCRIPTION OF THE FIGURES

Embodiments of the invention will be apparent from the following detailed description and the appended claims and drawings in which:

DETAILED DESCRIPTION OF THE EMBODIMENTS

Embodiments of the present invention include providing a method to build a fast transmit-receive (T/R) switching architecture that may (i) be used to implement fifth generation (5G) transceiver (TRX) beam formers, (ii) switch between transmit and receive channels in response to a hardwired control signal, (iii) provide a switching speed compliant with 5G communication systems, (iv) provide a settling time compliant with 5G communication systems, and/or (v) be implemented as one or more integrated circuits.

Figure 1:
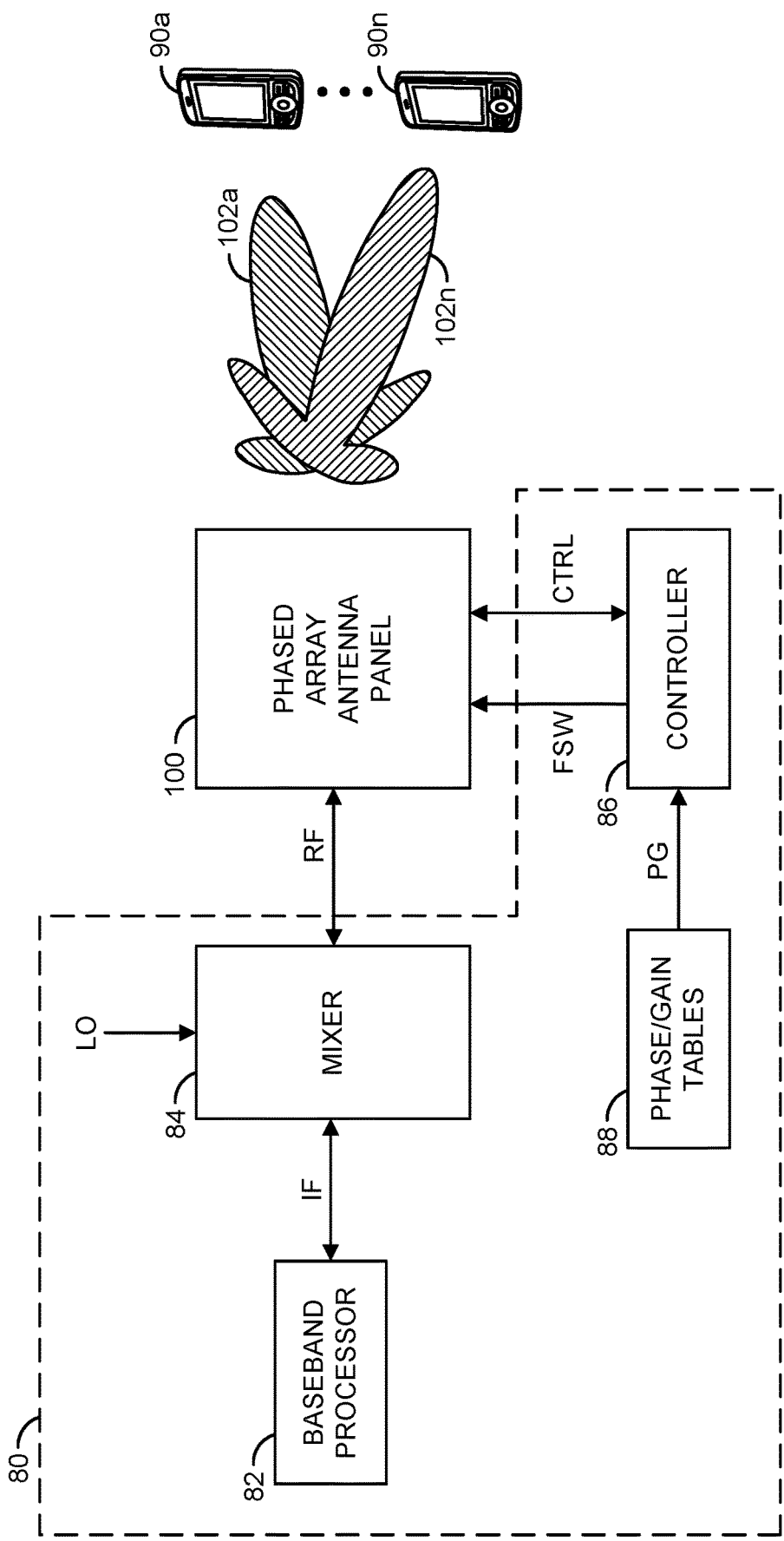
FIG. 1 is a diagram of a system illustrating an example context of the invention.

Referring to FIG. 1, a block diagram of a system 80 is shown illustrating an example context of the invention. The system (or module or circuit or apparatus) 80 may implement a radio-frequency (RF) transceiver system in accordance with an example embodiment of the invention. The RF transceiver system 80 may be configured to operate at common wireless radio frequencies, millimeter-wave frequencies, and/or microwave frequencies. In an example, the RF transceiver system 80 may be configured to facilitate communication with and/or between a plurality of communications devices (or terminals) 90a-90n. In an example, the communications devices 90a-90n may include, but are not limited to, cellular telephones, mobile devices, tablets, internet-of-things (IoT) equipment, etc. In various embodiments, the RF transceiver system 80 and the communications devices 90a-90n may be coupled using at least one phased array antenna panel 100 in accordance with an example embodiment of the invention.

In an example, the RF transceiver system 80 may form part of a communications link. In some embodiments, the communications link may be part of a fifth generation (5G) wireless communications system (e.g., for which a standard is currently under development by the Next Generation Mobile Networks (NGMN) Alliance). In other embodiments, the communications link may be part of systems including, but not limited to, a fourth generation (4G) wireless communications system (e.g., International Mobile Telecommunications-Advanced (IMT-A) standard published by the International Telecommunications Unit Radiocommunication Sector (ITU-R)), a satellite communication (SATCOM) system, and point-to-point communications systems such as common data link (CDL). However, other communications standards may be implemented to meet the design criteria of a particular application.

In an example, the RF transceiver system 80 may comprise a block (or circuit) 82, a block (or circuit) 84, a block (or circuit) 86, and a block (or circuit) 88. In various embodiments, the blocks 82-88 may be implemented with hardware, a combination of hardware and software, and/or simulated with software. A signal (e.g., IF) may be exchanged between the circuit 82 and the circuit 84. The signal IF may implement an intermediate-frequency signal. In an example, the signal IF may be configured (e.g., using various modulation schemes) to carry information to be transmitted from and/or received by the RF transceiver system 80. In an example, a signal (e.g., LO) may be presented to the circuit 84. The signal LO may implement a local oscillator signal. A signal (e.g., RF) may be exchanged between the circuit 84 and the phased array antenna panel 100. The signal RF may be a radio-frequency, millimeter-wave frequency, or microwave frequency signal that conveys the information also found in the intermediate-frequency signal IF.

In a transmit mode, the radio-frequency signal RF may convey information to be broadcast from the phased array antenna panel 100 to the devices 90a-90n. In a receive mode, the radio-frequency signal RF may convey information received from the devices 90a-90n via the phased array antenna panel 100. A signal (e.g., FSW) and a signal or signals (e.g., CTRL) may be exchanged between the circuit 86 and the phased array antenna panel 100. The signal FSW may switch the phased array antenna panel 100 between the transmit mode and the receive mode. The signal(s) CTRL may convey data, clocking, and control elements. In an example, the signals FSW and CTRL may be part of a digital interface of the phased array antenna panel 100.

In an example, the signal(s) CTRL may be implemented as a serial link that conveys information for configuring and/or determining phase and/or gain settings for antenna elements of the phased array antenna panel 100. In an example, the signal(s) CTRL may be compliant with one or more serial communication protocols or interfaces (e.g., serial peripheral interface (SPI), inter-integrated circuit communications ($I^2C$), daisy chain, etc.). A signal or signals (e.g., PG) may be transferred from the circuit 88 to the circuit 86. In an example, the signal(s) PG may convey phase information and gain information used by the circuit 86 to implement (control) beam steering using the phased array antenna panel 100. In an example, the signal(s) PG may convey a plurality of phase and gain valves that may be programmed into a plurality of beam former circuits of the phased array antenna panel 100 via the signal(s) CTRL.

The phased array antenna panel 100 generally implements a hard-wired address scheme. The hard-wired address scheme may be used to uniquely identify serial communications intended for elements (e.g., the beam former circuits) of the phased array antenna panel 100. In various embodiments, multiple phased array antenna panels 100 may be combined to form a larger antenna array that may provide more transmission channels. The multiple phased array antenna panels may share a serial communication channel, link, or bus. Each of the phased array antenna panels 100 making up the larger antenna array may be uniquely addressed using respective hard-wired addresses.

The phased array antenna panel 100 may generate one or more fields (or beams) 102a-102n. The fields 102a-102n may represent a field pattern (or radio-frequency beam pattern) created by the beam former circuits of the phased array antenna panel 100 based upon the phase and gain information (values) received via the signal(s) CTRL. The phased array antenna panel 100 may be configured to produce directional beams 102a-102n for communication with the communication devices 90a-90n. In an example, the phased array antenna panel 100 may be controlled to steer the beams 102a-102n, based on the phase and gain information received via the signal(s) CTRL, to track movement of the communication devices 90a-90n and/or switch between the communication devices 90a-90n.

The circuit 82 may implement a baseband processor circuit. The circuit 82 may be operational to process the information sent by and/or received in the intermediate-frequency signal IF. The circuit 82 may process the information within the RF transceiver system 80. The processing may include, but is not limited to, modulation/demodulation of the signal that contains the information and management of simultaneous communications between the RF transceiver system 80 and the multiple remote terminals 90a-90n.

The circuit 84 may implement one or more mixer circuits. The circuit 84 is generally operational to frequency convert (e.g., up-convert, down-convert, etc.) between an intermediate frequency used for the signal IF and the radio frequency, millimeter-wave frequency, or microwave frequency used for the signal RF. The frequency conversion may be based on one or more local oscillator frequencies provided by the signal LO. In various embodiments, the radio-frequency signal RF may be in a range of frequencies approximately centered around a center frequency of either 28 gigahertz (GHz) or 39 GHz (e.g., 24 GHz to 30 GHz or 37 GHz to 44 GHz). In embodiments implementing multiple intermediate frequencies, each intermediate frequency may cover a band from approximately 2 GHz to about 6 GHz (e.g., an approximately 4 GHz bandwidth). In an example, each local oscillator frequency may range from approximately 22 GHz to 26 GHz when the signal RF is approximately centered at 28 GHz. In another example, each local oscillator frequency may range from approximately 33 GHz to 37 GHz when the signal RF is approximately centered at 39 GHz. However, other frequency ranges may be implemented to meet the design criteria of a particular application.

The circuit 86 may implement a control circuit. In various embodiments, the circuit 86 may be implemented using one or more of an application specific integrated circuit (ASIC), controller, microprocessor, or circuitry configured accordingly. The circuit 86 is generally operational to control the operations of the phased array antenna panel 100. In some embodiments, the circuit 86 may determine the setting values used in each transceiver channel within the beam former circuits of the phased array antenna panel 100. The setting values may establish the geometry of the field(s) or beam(s) 102*a*-102*n*. In various embodiments, the circuit 86 may be implemented as one or more integrated circuits.

In an example, the circuit 88 may implement a table of values (e.g., embodied in a memory circuit). In an example, the table of values embodied in the circuit 88 may be configured to store multiple gain (G) values and multiple phase (P) values. The phase and gain values may be used by the transceiver channels in the phased array antenna panel 100 to establish the fields 102*a*-102*b*. The phase values and the gain values may be fetched from the circuit 88 via the signal PG and programmed into buffers associated with the beam former circuits of the phased array antenna panel 100 by the circuit 86. In various embodiments, the circuits 86 and 88 may be implemented either on the same integrated circuit or on different (separate) integrated circuits.

In an example, the phased array antenna panel 100 may be implemented comprising either single-polarization (or single-pole) antenna elements or dual-polarization (or dual-pole or di-pole) antenna elements. The phased array antenna panel 100 may be operational to transmit and receive wireless signals to and from the devices (or terminals) 90*a*-90*n*. The devices (or terminals) 90*a*-90*n* may be remotely located from the RF transceiver system 80. Sensitivity to the wireless signals may be determined by the fields 102*a*-102*n* created by the phased array antenna panel 100. The phased array antenna panel 100 may comprise a plurality of antenna elements and a plurality of beam former circuits. Each beam former circuit may implement a plurality of transceiver channels. Each transceiver channel generally comprises a transmit channel and a receive channel. The transceiver channels may be coupled to the antenna elements by corresponding bidirectional radio-frequency signals. The transceiver channels and antenna elements generally form a two-dimensional antenna network.

Figure 2:
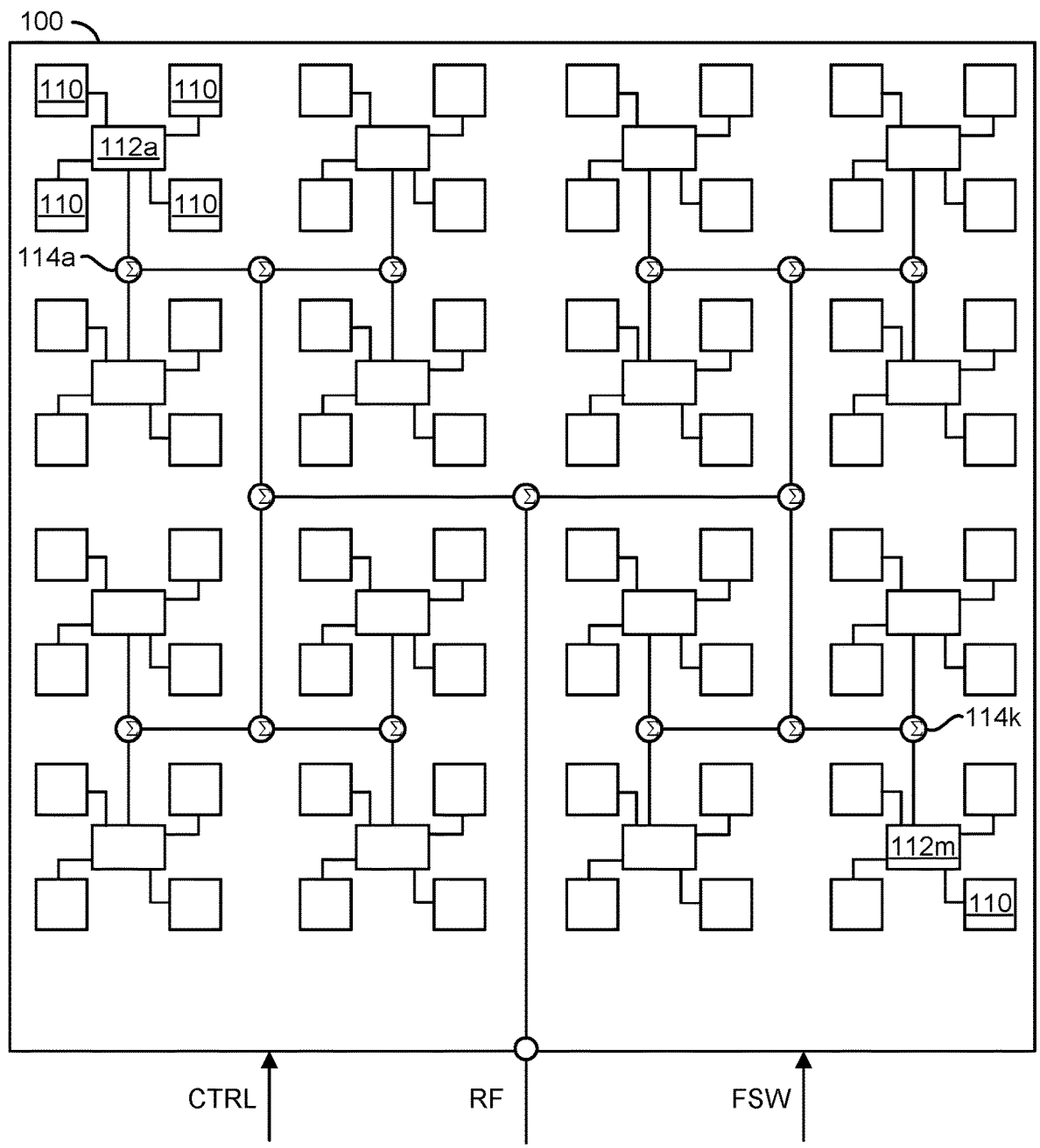
FIG. 2 is a diagram illustrating an example implementation of a single-polarization phased array antenna panel in accordance with an example embodiment of the invention.

Referring to FIG. 2, a diagram is shown illustrating an example implementation of a single-polarization version of the phased array antenna panel 100 in accordance with an embodiment of the invention. In an example, the phased array antenna panel 100 may comprise a number of blocks (or circuits) 110, a number of blocks (or circuits) 112*a*-112*m*, and a number of blocks (or circuits) 114*a*-114*k*. In embodiments implementing a single-polarization phased array antenna panel, the blocks 110 generally are implemented as single polarization (or single-pole) antenna elements. Each of the circuits 112*a*-112*m* may implement a single-polarization beam former circuit. Each of the circuits 114*a*-114*k* may implement a combiner/splitter circuit. The circuits 112*a*-112*m*, and 114*a*-114*k* may be implemented with hardware, a combination of hardware and software, and/or simulated with software. In an example, the signal RF may be exchanged with one of the circuits 114*a*-114*k*. The signals FSW and CTRL may be exchanged with the circuits 112*a*-112*m*.

The antenna elements 110 in the phased array antenna panel 100 may be used for both transmission and reception. A physical positioning of the antenna elements 110 generally provides for two-dimensional (e.g., horizontal and vertical) control of the fields 102*a*-102*n*. In an example, the antenna elements 110 may be arranged in a 2-dimensional (e.g., N×N) grid pattern, where N is an integer value divisible by two. However, other dimensions of grid patterns may be implemented accordingly to meet design criteria of a particular implementation.

The circuits 112*a*-112*m* are generally operational to multiplex/demultiplex the signal RF with a number of the antenna elements 110. In various embodiments, each of the circuits 112*a*-112*m* may be mounted on a substrate of the phased array antenna panel 100 adjacent to (e.g., centered among) a number (or group) of the antenna elements 110. In an example, each circuit 112*a*-112*m* generally comprises a number of transceiver channels that are coupled to respective antenna elements 110. In an example, each circuit 112*a*-112*m* may be coupled to four adjacent antenna elements 110 (e.g., arranged in a 2×2 grid around each circuit 112*a*-112*m*). However, other numbers (e.g., 1, 2, 4, 18, etc.) of adjacent antenna elements 110 may be implemented to meet design criteria of a particular implementation.

The circuits 112*a*-112*m* may be configured to switch between a transmit mode and a receive mode in response to the signal FSW. In the transmit mode, the circuits 112*a*-112*m* may be operational to rapidly change setting values (e.g., phase values, gain values, etc.) used by the transceiver channels in order to steer the beams (or fields) 102*a*-102*n* formed by the phased array antenna panel 100. In various embodiments, each of the circuits 112*a*-112*m* may be implemented as one or more integrated circuits (e.g., in a package or multi-chip module (MCM)).

In various embodiments, each of the circuits 114*a*-114*k* may be implemented as a combiner/splitter circuit. In an example, the circuits 114*a*-114*k* may be implemented as Wilkinson combiner/splitters. In various embodiments, the circuits 114*a*-114*k* may be coupled together to form a network that couples the circuits 112*a*-112*m* to an input/output of the phased array antenna panel 100 configured to present/receive the signal RF. In the transmit mode, the circuits 114*a*-114*k* are generally operational to distribute the power in the signal RF among the circuits 112*a*-112*m*. In the receive mode, the circuits 114*a*-114*k* may be operational to combine the power received in signals from the circuits 112*a*-112*m* into the signal RF. The circuits 112*a*-112*n* and 114*a*-114*k* are generally configured to provide a substantially equivalent path length between the RF input/output of the phased array antenna panel 100 and each of the circuits 112*a*-112*m*.

Figure 3:
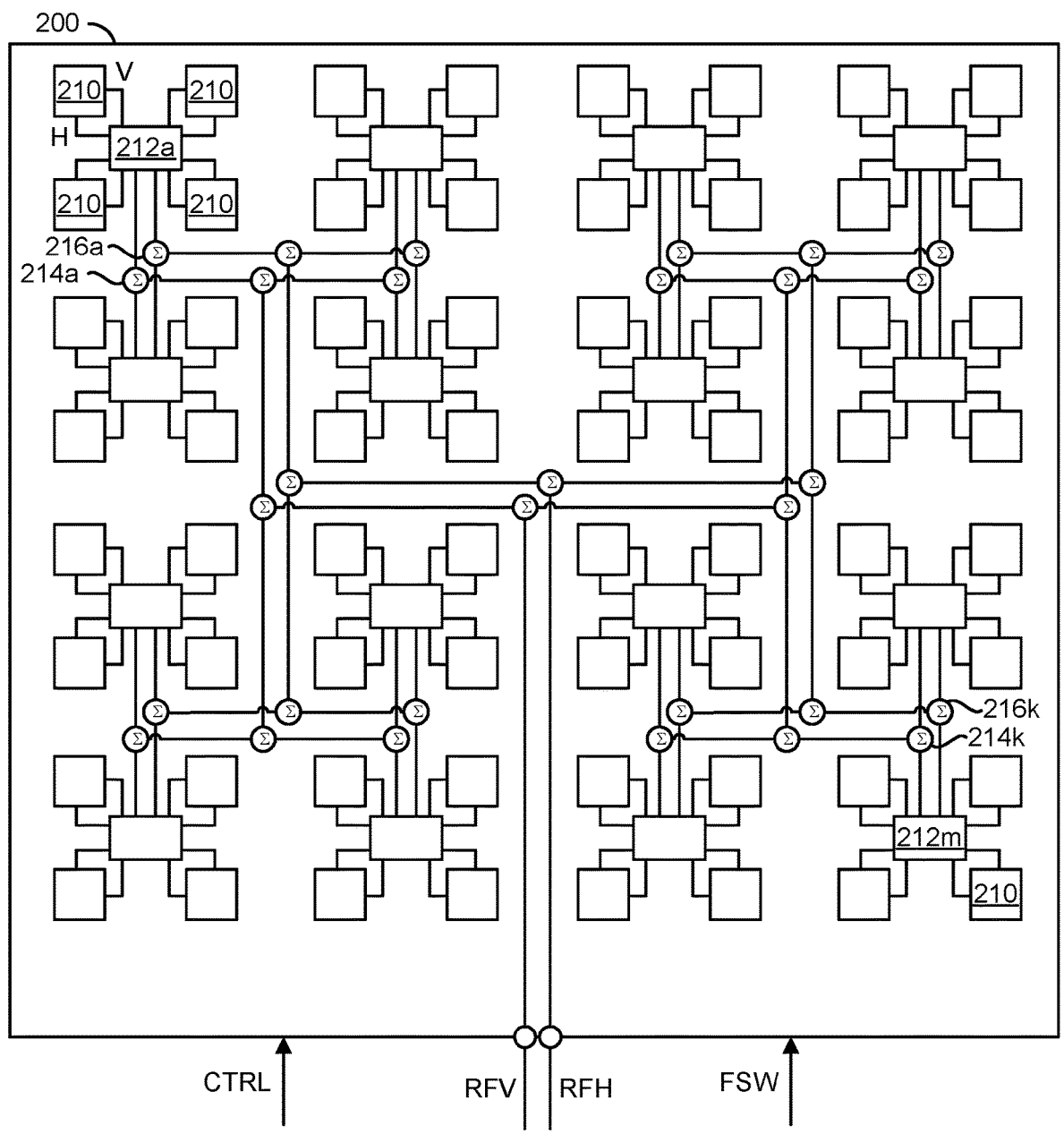
FIG. 3 is a diagram illustrating an example implementation of a dual-polarization phased array antenna panel in accordance with an example embodiment of the invention.

Referring to FIG. 3, a diagram is shown illustrating an example implementation of a dual-polarization phased array antenna panel 200 in accordance with another example embodiment of the invention. In embodiments implementing dual-polarization transceiver channels, the phased array antenna panel 200 may be used in place of the phased array antenna panel 100 of FIG. 1. In an example, the phased array antenna panel 200 may comprise a number of blocks (or circuits) 210, a number of blocks (or circuits) 212*a*-212*m*, a number of blocks (or circuits) 214*a*-214*k*, and a number of blocks (or circuits) 216*a*-216*k*. In embodiments implementing a dual-polarization phased array antenna panel, the blocks 210 generally are implemented as dual-polarization (or dual-pole or di-pole) antenna elements. Each of the circuits 212*a*-212*m* may implement a dual-polarization beam former circuit. Each of the circuits 214*a*-214*k* and 216*a*-216*k* may implement a combiner/splitter circuit. The circuits 212*a*-212*m*, 214*a*-214*k*, and 216*a*-216*k* may be implemented with hardware, a combination of hardware and software, and/or simulated with software. In embodiments implementing the dual-polarization phased array antenna panel 200, the signal RF may comprise a vertical polarized component (e.g., RFV) and a horizontal polarized component (e.g., RFH). In an example, the signal RFV may be exchanged with one of the circuits 214*a*-214*k* and the signal RFH may be exchanged with one of the circuits 216*a*-216*k*. The signals FSW and CTRL may be exchanged with the circuits 212*a*-212*m*.

The antenna elements 210 in the phased array antenna panel 200 may be used for both transmission and reception.

A physical positioning of the antenna elements 210 generally provides for two-dimensional (e.g., horizontal and vertical) control of the fields 102a-102n. In an example, the antenna elements 210 may be arranged in a 2-dimensional (e.g., N×N) grid pattern, where N is an integer value divisible by 2. However, other dimensions of grid patterns may be implemented accordingly to meet design criteria of a particular implementation.

The circuits 212a-212m are generally operational to multiplex/demultiplex the signals RFV and RFH with a number of the antenna elements 210. In various embodiments, each of the circuits 212a-212m may be mounted on a substrate of the phased array antenna panel 200 adjacent to a number of the antenna elements 210. Each of the circuits 212a-212m may have respective horizontal (H) and vertical (V) input/outputs that may be coupled to corresponding horizontal (H) and vertical (V) input/outputs (or feeds) of the adjacent antenna elements 210. In an example, each circuit 212a-212m generally comprises a number of transceiver channels that are coupled to respective horizontal and vertical input/outputs. In an example, each circuit 212a-212m may be coupled to four adjacent antenna elements 210 (e.g., arranged in a 2×2 grid around each circuit 212a-212m).

The circuits 212a-212m may be configured to switch between a transmit mode and a receive mode in response to the signal FSW. In the transmit mode, the circuits 212a-212m may be operational to rapidly change setting values (e.g., phase values, gain values, etc.) used by the transceiver channels in order to steer the fields 102a-102n formed by the phased array antenna panel 200. In various embodiments, each of the circuits 212a-212m may be implemented as one or more integrated circuits (e.g., in a package or multi-chip module (MCM)). In an example, each of the circuits 212a-212m may be mounted on a substrate of the phased array antenna panel 200 adjacent to (e.g., centered among) the respective antenna elements 210.

In various embodiments, each of the circuits 214a-214k and 216a-216k may implement a combiner/splitter circuit. In an example, each of the circuits 214a-214k and 216a-216k may be implemented as a Wilkinson combiner/splitter circuit. The circuits 214a-214k may be coupled together to form a network that couples the circuit 212a-212m to an input/output of the phased array antenna panel 200 configured to present/receive the signal RFV. The circuits 216a-216k may be coupled together to form a network that couples the circuit 212a-212m to an input/output of the phased array antenna panel 200 configured to present/receive the signal RFH. In the transmit mode, the circuits 214a-214k and 216a-216k are generally operational to distribute the power in the signals RFV and RFH, respectively, among the circuits 212a-212m. In the receive mode, the circuits 214a-214k and 216a-216k may be operational to combine the power received in signals from the circuits 212a-212m, respectively, into the signals RFV and RFH. The circuits 212a-212n, 214a-214k, and 216a-216k are generally configured to provide a substantially equivalent path length between the RFV input/output and the RFH input/output of the phased array antenna panel 200 and each of the circuits 212a-212m.

Figure 4:
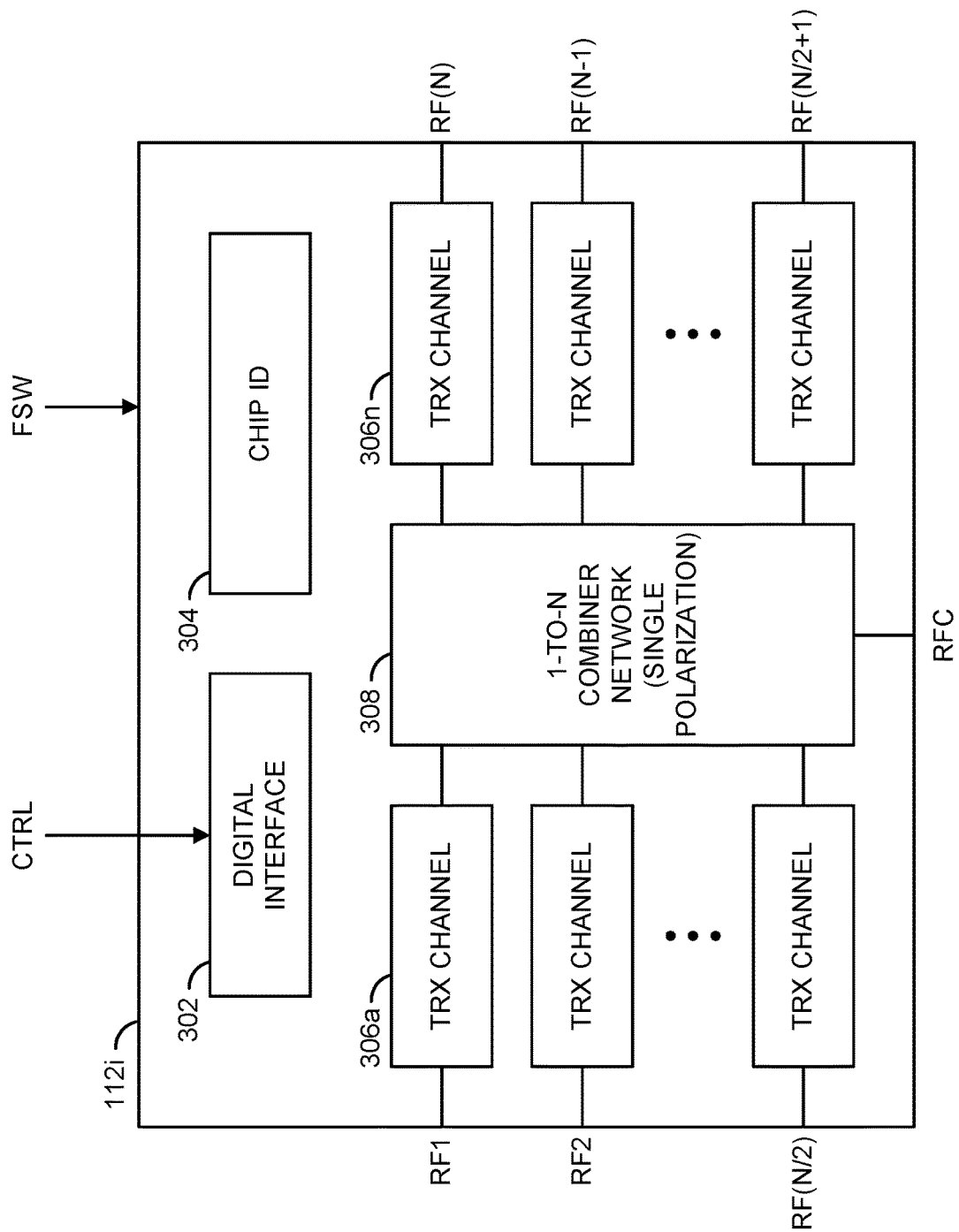
FIG. 4 is a diagram of a single-polarization beam former circuit in accordance with an example embodiment of the invention.

Referring to FIG. 4, a diagram is shown illustrating an example implementation of a single-polarization beam former circuit 112i in accordance with an example embodiment of the invention. In an example, the single-polarization beam former circuit 112i may be representative of the single-polarization beam former circuits 112a-112m of FIG. 2. In an example, the single-polarization beam former circuit 112i may have a digital interface configured to receive the signal FSW and the signal(s) CTRL, a common RF input/output port (RFC), and a number of antenna input/output ports (RF1-RFN). In general, any number (e.g., N) of antenna input/output ports (or channels) may be implemented accordingly to meet design criteria of a particular implementation.

In various embodiments, the signal RF may be presented/received by the common RF input/output RFC, and the antenna input/output ports RF1-RFN may be coupled to respective antenna elements 110. The single-polarization beam former circuit 112i generally implements a number of transceiver channels corresponding to the number of antenna input/output ports RF1-RFN. In various embodiments, each of the transceiver channels may comprise a respective transmit channel and a respective receive channel. The transceiver channels are generally configured to switch between transmitting or receiving based upon the signal FSW.

The single-polarization beam former circuit 112i generally implements a transmit mode and a receive mode. In an example, a state of the signal FSW may determine whether the transmit mode or the receive mode is active. In the transmit mode, the single-polarization beam former circuit 112i is generally configured to receive the radio frequency signal RF at the common input/output port RFC and present radio frequency signals at the antenna input/output ports RF1-RFN. The signals presented at each of the antenna input/output ports RF1-RFN are generated by the single-polarization beam former circuit 112i in response to the radio frequency signal RF received at the common input/output port RFC and a respective number of setting values (e.g., gain, phase, etc.) for each transceiver channel corresponding to each of the antenna input/output ports RF1-RFN. In the receive mode, the single-polarization beam former circuit 112i is generally configured to combine radio frequency signals received at the antenna input/output ports RF1-RFN for presentation as the signal RF at the common input/output port RFC.

In an example, the single-polarization beam former circuit 112i may comprise a block (or circuit) 302, a block (or circuit) 304, a number of blocks (or circuits) 306a-306n, and a block (or circuit) 308. The circuit 302 may implement an interface circuit. In various embodiments, the circuit 302 may implement a digital interface. The circuit 304 may implement a hard-wired address (e.g., chip ID) for the beam former circuit 112i. The circuits 306a-306n may implement the transceiver (TRX) channels. The circuit 308 may implement a 1-to-N combiner/splitter network.

In an example, the signals FSW and CTRL may be exchanged with the circuit 302. In an example, the circuit 302 may comprise a serial interface. The circuit 302 may be configured to be compliant with one or more serial interface standards including, but not limited to, serial peripheral interface (SPI), inter-integrated circuit ($I^2C$), daisy chain, etc. In an example, the circuit 302 may be configured to allow programming and control of the single-polarization beam former circuit 112i using a serial communication link (or bus). In an example, the circuit 302 may be configured to program and control the circuits 306a-306n in response to the signals CTRL and FSW. In an example, the circuit 302 may control whether the circuits 306a-306n operate in a transmit mode or a receive mode in response to the signal FSW.

In an example, the circuit 302 may implement a 4-wire embedded SPI core. In an example, the circuit 304 may set a physical address of the beam former circuit 112i based upon hardware coded address bits (or pins). In some embodiments, the hard-wired address bits may be hard coded within the chip implementing the beam former 112i. In some embodiments, the hard-wired address bits may be programmable within the chip implementing the beam former 112i during manufacturing. In an example, the hard-wired address bits may be programmed using fuses, anti-fuses, or other conventional techniques.

Figure 5:
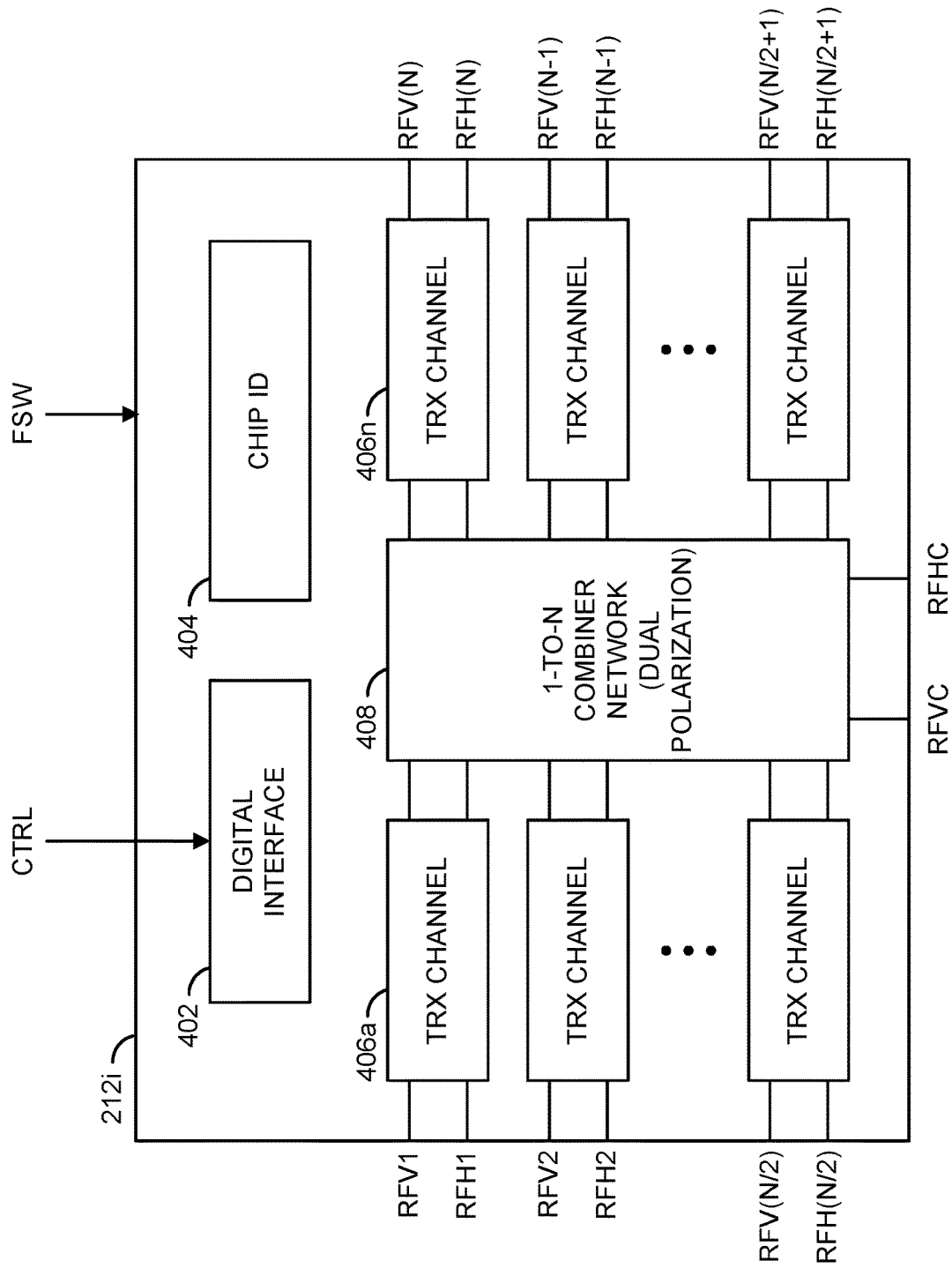
FIG. 5 is a diagram of a dual-polarization beam former circuit in accordance with an example embodiment of the invention.

Referring to FIG. 5, a diagram is shown illustrating an example implementation of a dual-polarization beam former circuit 212i in accordance with an example embodiment of the invention. In an example, the dual-polarization beam former circuit 212i may be representative of the dual-polarization beam former circuits 212a-212m of FIG. 3. In an example, the dual-polarization beam former circuit 212i may have a digital interface configured to receive the signal FSW and the signal(s) CTRL, a first common RF input/output port (RFVC), a second common RF input/output port (RFHC), a number of vertical antenna input/output ports (RFV1-RFV(N)), and a number of horizontal antenna input/output port (RFH1-RFH(N)). In general, any number (e.g., N) of vertical and horizontal antenna input/output ports (or channels) may be implemented accordingly to meet design criteria of a particular implementation.

In various embodiments, the signal RFV may be presented/received by the common RF input/output RFVC, the signal RFH may be presented/received by the common RF input/output RFHC, the vertical antenna input/output ports RFV1-RFV(N) may be coupled to corresponding vertical input/outputs of the respective antenna elements 210, and the horizontal antenna input/output ports RFH1-RFH(N) may be coupled to corresponding horizontal input/outputs of the respective antenna elements 210. The dual-polarization beam former circuit 212i generally implements a number (e.g., N) of transceiver channels corresponding to the number of pairs of vertical and horizontal antenna input/output ports (RFV1, RFH1), (RFV2, RFH2), ... (RFV(N), RFH (N)). In various embodiments, each of the transceiver channels may comprise a respective transmit channel and a respective receive channel. The transceiver channels are generally configured to switch between transmitting or receiving based upon the signal FSW.

The dual-polarization beam former circuit 212i generally implements a transmit mode and a receive mode. In an example, a state of the signal FSW may determine whether the transmit mode or the receive mode is active. In the transmit mode, the dual-polarization beam former circuit 212i is generally configured to receive radio frequency signals at the common input/output ports RFVC and RFHC, and present radio frequency signals at the antenna input/output ports RFV1-RFV(N) and RFH1-RFH(N). The signals presented at each of the antenna input/output ports RFV1-RFV(N) and RFH1-RFH(N) are generated by the dual-polarization beam former circuit 212i in response to the radio frequency signals received at the common input/output ports RFVC and RFHC and a respective number of setting values (e.g., gain, phase, etc.) corresponding to each of the antenna input/output ports RFV1-RFV(N) and RFH1-RFH (N). In the receive mode, the dual-polarization beam former circuit 212i is generally configured to combine radio frequency signals received at the antenna input/output ports RFH1-RFH(N) and RFV1-RFV(N) for presentation as the signals RFH and RFV at the common input/output ports RFHC and RFVC, respectively.

In an example, the dual-polarization beam former circuit 212i may comprise a block (or circuit) 402, a block (or circuit) 404, a number of blocks (circuits) 406a-406n, and a block (or circuit) 408. The circuit 402 may implement an interface circuit. In various embodiments, the circuit 402 may implement a digital interface. The circuit 404 may implement a hard-wired address (e.g., chip ID) for the beam former circuit 212i. The circuits 406a-406n may implement the transceiver (TRX) channels. The circuit 408 may implement a 1-N dual-polarization combiner/splitter network.

In an example, the signals FSW and CTRL may be exchanged with the circuit 402. In an example, the circuit 402 may comprise a serial interface. The circuit 402 may be configured to be compliant with one or more serial interface standards including, but not limited to, serial peripheral interface (SPI), inter-integrated circuit ($I^2C$), daisy chain, etc. In an example, the circuit 402 may be configured to allow programming and control of the dual-polarization beam former circuit 212i using a serial communication link (or bus). In an example, the circuit 402 may be configured to program and control the circuits 406a-406n in response to the signals CTRL and FSW. In an example, the circuit 402 may control whether the circuits 406a-406n operate in a transmit mode or a receive mode in response to the signal FSW.

In an example, the circuit 402 may implement a 4-wire embedded SPI core. In an example, the circuit 404 may set a physical address of the dual-polarization beam former circuit 212i based upon hardware coded address bits (or pins). In some embodiments, the hard-wired address bits may be hard coded within the chip implementing the beam former 212i during manufacturing. In some embodiments, the hard-wired address bits may be programmable within the chip implementing the beam former 212i during manufacturing. In some embodiments, the hard-wired address bits may be programmed using fuses, anti-fuses, or other conventional techniques.

Figure 6:
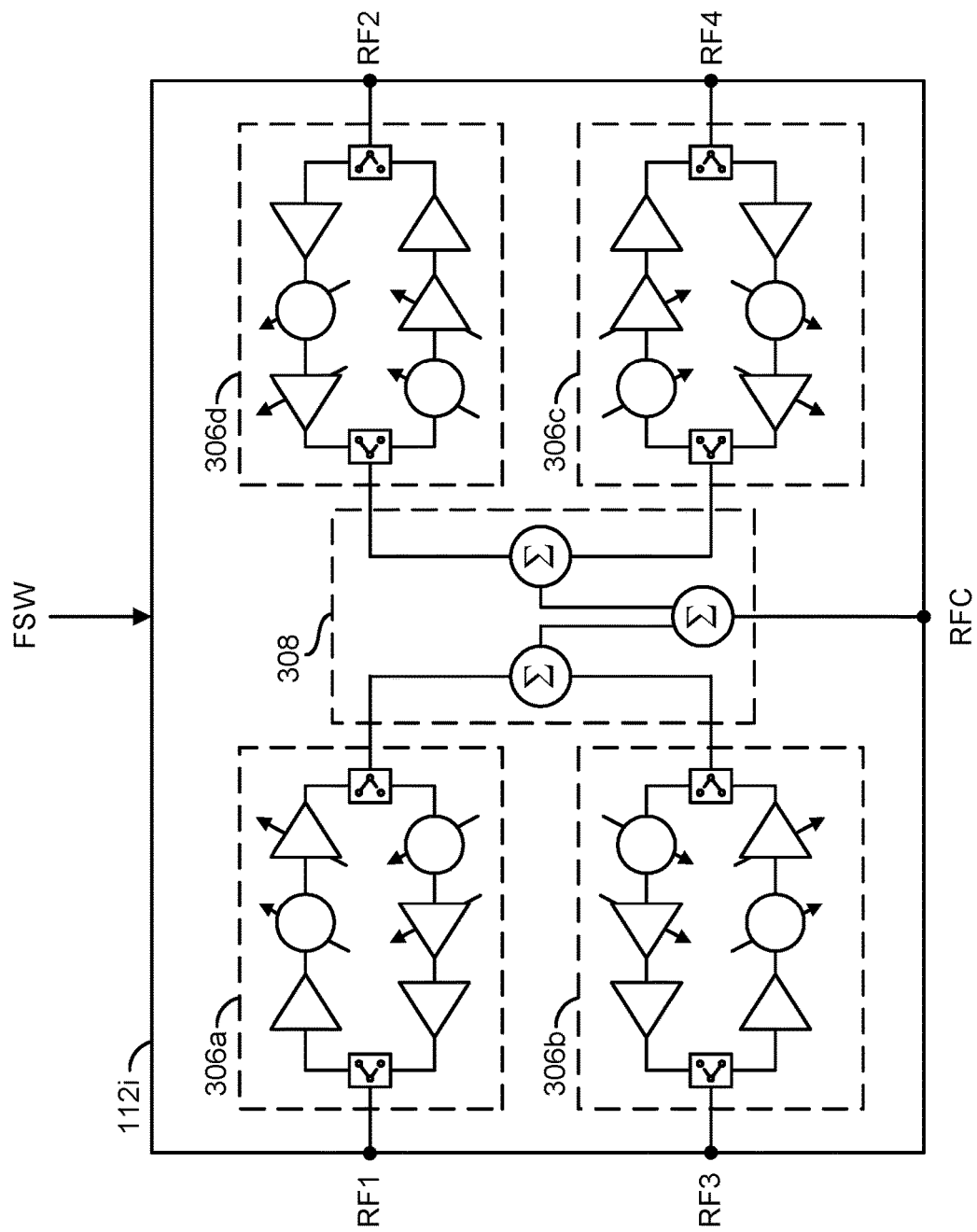
FIG. 6 is a diagram illustrating an example implementation of a generic 2×2 four-element single-polarization transceiver beam former circuit in accordance with an example embodiment of the invention.

Referring to FIG. 6, a diagram is shown illustrating an example implementation of a generic 2×2 four-element single-polarization transceiver beam former circuit 112i in accordance with an example embodiment of the invention. In various embodiments, beam former circuits may implement a plurality of transceiver channels. Each transceiver channel generally comprises a transmit channel and a receive channel. In an example, the 2×2 four-element single-polarization transceiver beam former circuit 112i may implement four transceiver channels 306a-306d. The four transceiver channels (or circuits) 306a-306d may be coupled to respective antenna elements in a group of adjacent antenna elements by corresponding bidirectional radio-frequency signals (e.g., RF1-RF4). The transceiver channels and antenna elements generally form a two-dimensional antenna network.

In an example, the circuit 308 maybe implemented as a 1-4 combiner/splitter network. In an example, the circuit 308 may comprise a number of combiner/splitter circuits. In an example, the combiner/splitter circuits may be passive circuits. In an example, the combiner/splitter circuits may be implemented as Wilkinson combiner/splitter circuits. In various embodiments, the combiner/splitter circuits may be coupled together to form a network that couples the circuits 306a-306d to a common RF input/output port RFC of the beam former circuit 112i. In the transmit mode, the circuit 308 is generally operational to distribute the power in a signal at the common RF input/output port RFC among the circuits 306a-306d. In the receive mode, the circuit 308 may be operational to combine the power received in signals from the circuits 306a-306d into a signal presented at the common RF input/output port RFC. The circuits 306a-306d and 308 are generally configured to provide a substantially equivalent path length between the common RF input/output port RFC and each of the circuits 306a-306d. The topology of the beam former circuit 112i may be scaled to provide other numbers of transceiver channels to meet the design criteria of a particular implementation.

Figure 7:
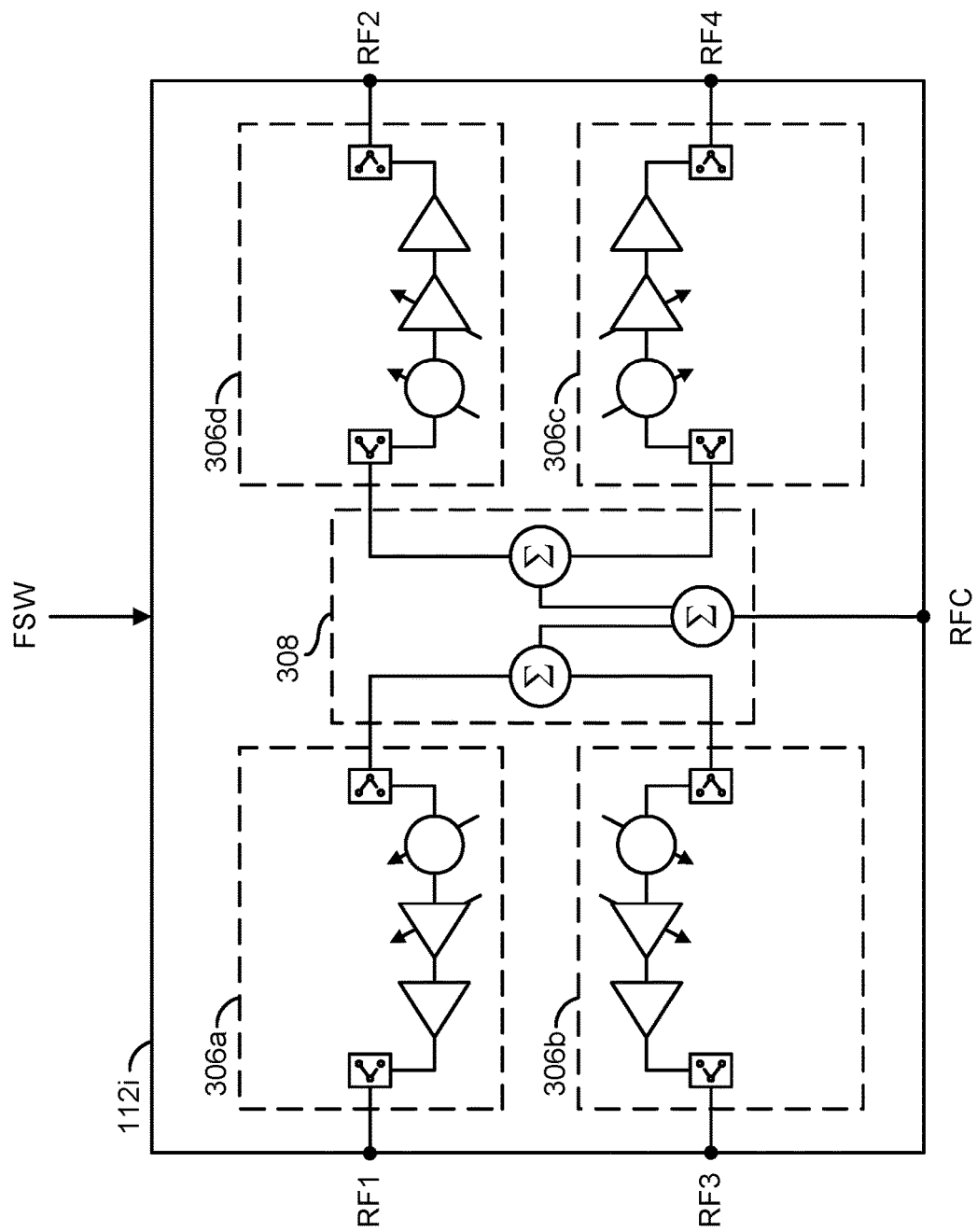
FIG. 7 is a diagram illustrating a transmit mode of the four channel single-polarization beam former circuit of FIG. 4.

Referring to FIG. 7, a diagram is shown illustrating a transmit mode of the four channel single-polarization beam former circuit 112i of FIG. 4. In an example, when the signal FSW is in a first (e.g., transmit mode) state, T/R switches of the beam former circuit 112i couple the transmit channel of each of the transceiver circuits 306a-306d between the circuit 308 and the respect antenna input/output RF1-RF4. In the transmit mode, the receive channels of each of the transceiver circuits 306a-306d are essentially isolated from the circuit 308 and the respect antenna input/output RF1-RF4.

Figure 8:
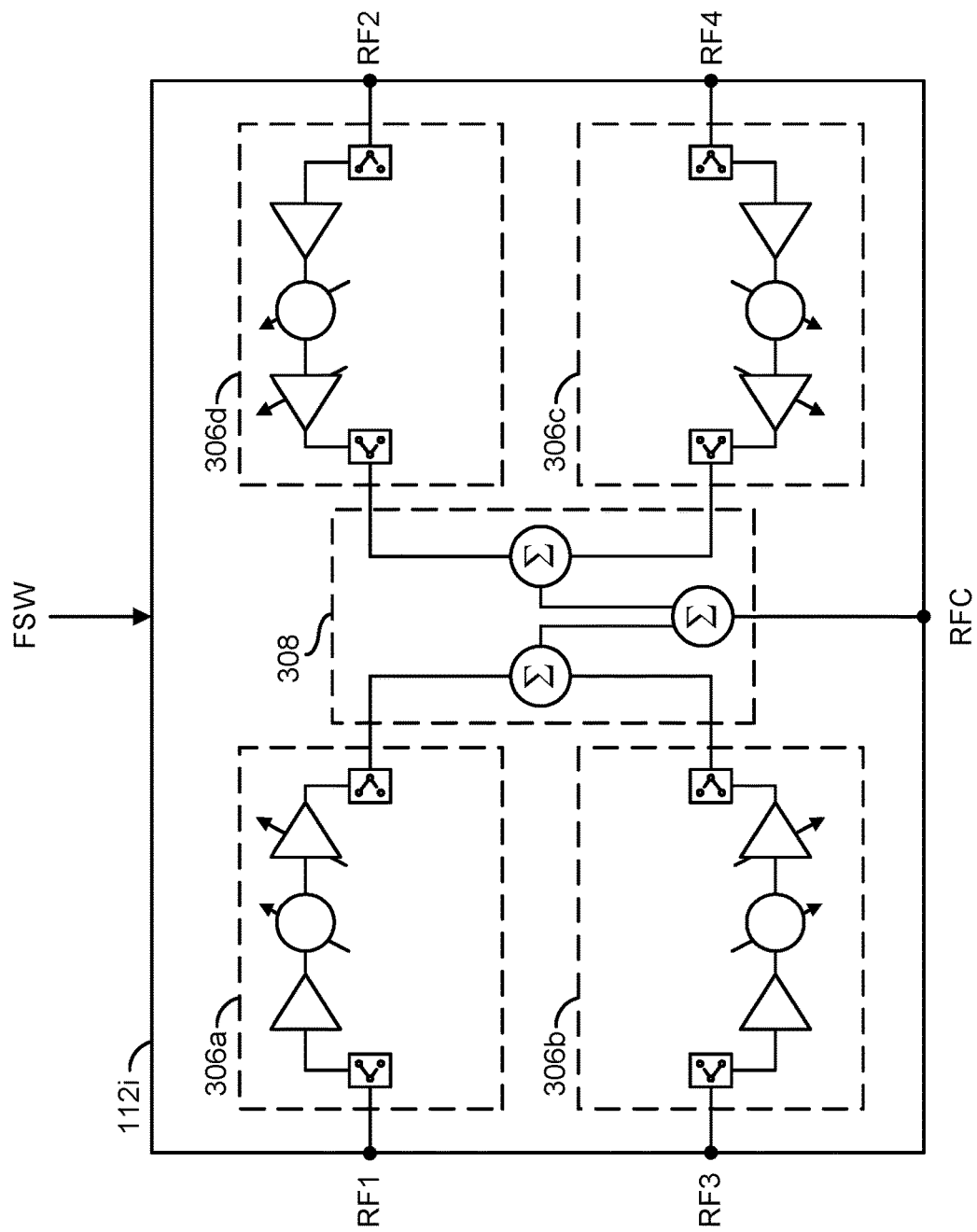
FIG. 8 is a diagram illustrating a receive mode of the four channel single-polarization beam former circuit of FIG. 4.

Referring to FIG. 8, a diagram is shown illustrating a receive mode of the four channel single-polarization beam former circuit 112i of FIG. 4. In an example, when the signal FSW is in a second (e.g., receive mode) state, the T/R switches of the beam former circuit 112i couple the receive channel of each of the transceiver circuits 306a-306d between the circuit 308 and the respect antenna input/output RF1-RF4. In the receive mode, the transmit channels of each of the transceiver circuits 306a-306d are essentially isolated from the circuit 308 and the respect antenna input/output RF1-RF4.

Figure 9:
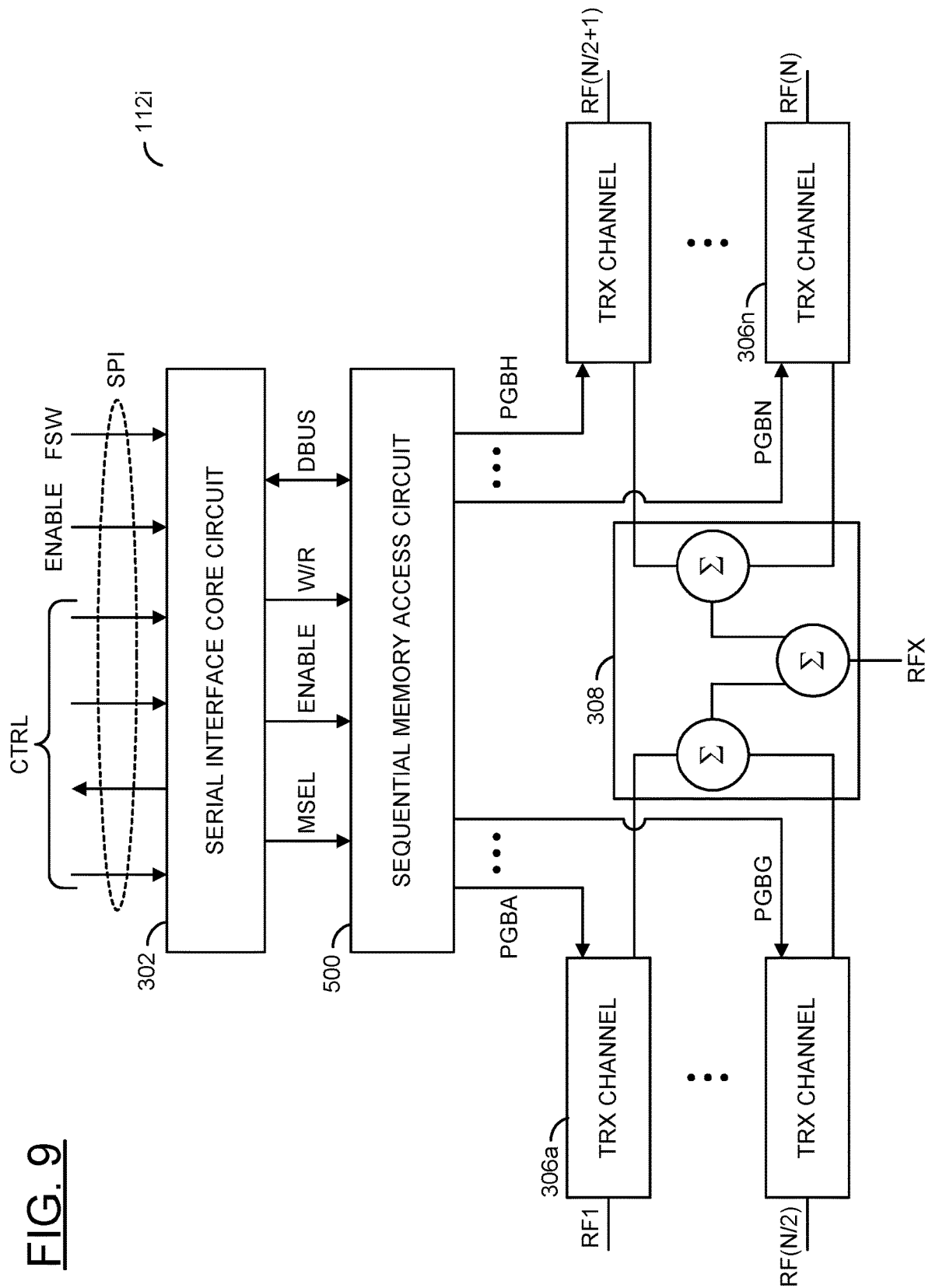
FIG. 9 is a diagram illustrating a fast memory access scheme for phase and gain control.

Referring to FIG. 9, a block diagram of an example implementation of fast memory access architecture in accordance with an embodiment of the invention is shown. In an example, the beam former circuit 112i generally comprises the digital interface circuit 302, the transceiver circuits 306a-306n, the combiner/splitter circuit 308, and a block (or circuit) 500. The circuit 500 may be implemented with hardware, a combination of hardware and software and/or simulated with software.

A signal SPI may comprise multiple signals (e.g., CTRL, ENABLE, and FSW). The signals CTRL may comprise a number of serial bus signals used to convey data and commands between the controller 86 and the beam former circuit 112i. The signal ENABLE may be received by the circuit 302 and transferred to the circuit 500. The signal ENABLE may be an enable signal synchronized to a clock signal received as part of the signals CTRL. The circuit 302 may receive the signal FSW. The signal FSW may be a hard-wired fast T/R switch signal used to switch the beam former circuit 112i between the transmit mode and the receive mode.

A signal (e.g., MSEL) may be generated by the circuit 302 and received by the circuit 500. The signal MSEL may be a mode select signal that alternately enables and disables a fast phase/gain switching function of the beam former 112i. The signal ENABLE may be transferred from the controller 86 through the circuit 302 to the circuit 500. The circuit 302 may generate a signal (e.g., W/R) received by the circuit 500. The signal W/R may be a write/read signal. While in a write state, the signal W/R may indicate a write of gain values, phase values and/or bias values into buffers within the circuit 500. While in a read state, the signal W/R may indicate a read of the gain values, the phase values and/or the bias values from the circuit 500. A signal (e.g., DBUS) may be exchanged between the circuit 302 and the circuit 500. The signal DBUS may be a bidirectional data bus signal used to transfer the various values between the circuits 302 and 500 along a local data bus. Multiple signals (e.g., PGBA to PGBN) may be generated by the circuit 500 and transferred to the transceiver channel circuits 306a-306n, respectively. Each signal PGBA to PGBN may carry a current phase value (P), a current gain value (G) and a current bias value (B) to be used by the corresponding transceiver channel circuits 306a-306n.

The circuit 302 may implement a serial protocol interface (SPI) core circuit. When implemented as a SPI core, the circuit 302 may be operational to provide communications between the beam former circuit 112i and the controller 86 via the signals CTRL, ENABLE, and FSW. In various embodiments, the circuit 302 may control the setting values (e.g., the gain values and the phase values) and/or the bias values buffered in the circuit 500. The setting values may provide several tens (e.g., 35) of decibels (dB) of gain control for the beams or fields 102a-102n. The setting values may also provide multiple bits (e.g., 5 bits) of phase control for the beams or fields 102a-102n. Other gain ranges and/or phase ranges may be implemented to meet the design criteria of a particular application. Loading of the setting values into the buffers within the circuit 500 is generally controlled by the mode select signal MSEL and the enable signal ENABLE. A topology of the system 80 generally utilizes a single pad for the signal ENABLE at the circuit 302 to control sequential access to the register layers. The single pad approach generally reduces a number of pads compared with common multi-pad designs that implement random access addressing for the registers.

The circuit 302 may also be operational to control the transmit/receive mode of the transceiver circuits 306a-306n using the fast switching signal FSW. A switching speed from the transmit mode to the receive mode may be fast (e.g., less than or equal to about 30 nanoseconds). A switching speed from the receive mode to the transmit mode may be similarly fast (e.g., less than or equal to about 130 nanoseconds). The fast switching signal FSW may be toggled between the transmit mode and the receive mode at a high frequency (e.g., at least 10 megahertz). Other frequencies of the fast switching signal FSW may be implemented to meet the design criteria of a particular application.

The circuit 500 may implement a sequential memory access circuit (or access circuit for short). The circuit 500 is generally operational to buffer multiple subsets (or layers) of the gain values, the phase values and the bias values for each of the transceiver channel circuits 306a-306n. In various embodiments, the number of subsets may be an integer N (e.g., 4, 32, 128, etc.) to provide fast beam redirecting to N remote devices in short order. Other numbers of subsets may be implemented to meet the design criteria of a particular application.

While the mode select signal MSEL is in the enable state, when the signal ENABLE changes from a hold state (or mode) to a transfer state (or mode), the circuit 500 may be operational to switch to a next subset of the gain values and the phase values thereby causing the beams or fields 102a-102n to be directed among different remote devices. The switching of the subsets may be triggered by an edge in the signal ENABLE transitioning to the transfer state, or a level of the signal ENABLE being in the transfer state.

Each load operation of a new subset of the gain values and the phase values into the transceiver channel circuits 306a-306n generally causes the beams or fields 102a-102n to adjust to a new location. The new subset may also cause adjustments of the beam geometry. The adjustments are generally achieved within a short period (e.g., under 30 nanoseconds) to meet a low-latency criterion. Once the current beams or fields 102a-102n have been adjusted, the RF transceiver system 80 may communicate bidirectionally with one or more of the remote wireless devices 90a-90n generally aligned with at least one lobe in the beams or fields 102a-102n. The communication is typically achieved during a burst lasting a specified dwell period (e.g., approximately one microsecond). After the dwell period has ended, a next subset of the gain values and the phase values may be loaded into the transceiver channel circuits 306a-306n to cause more adjustments of the beam location and/or geometry. The next beam location and/or geometry may be suitable for bidirectional communications with a next remote wireless device. Afterwards, the RF transceiver system 80 may communicate bidirectionally with the next remote wireless device or devices for another predetermined dwell period. Other switching speeds and/or lengths of the predetermined period may be implemented to meet the design criteria of a particular application.

While the mode select signal MSEL is in the disable state, the access circuit 500 may configure a first of multiple register control signals to follow the signal ENABLE. The other register control signals may be deasserted. The pulses in the first register control signal that follow the pulses in the signal ENABLE may be used by a first register layer of the access circuit 500 to load the gain values, the phase values and/or the bias values presented by the circuit 302.

In embodiments implementing the dual-polarization phased array antenna panel 200 of FIG. 3, the circuit 500 may be implemented similarly in the beam former circuits 212a-212m. In dual-polarization embodiments, the signals PGBA-PGBN may carry current phase (P) values, current gain (G) values, and current bias (B) values to be used by the horizontal and vertical channels of the corresponding dual-polarization transceiver channel circuits (e.g., the circuits 406a-406n illustrated in FIG. 5). In both single-polarization and dual-polarization embodiments, the circuit 500 may be implemented similarly to circuits described in co-owned U.S. patent application Ser. No. 15/817,909, filed Nov. 20, 2017, which is hereby incorporated by reference in its entirety.

Figure 10:
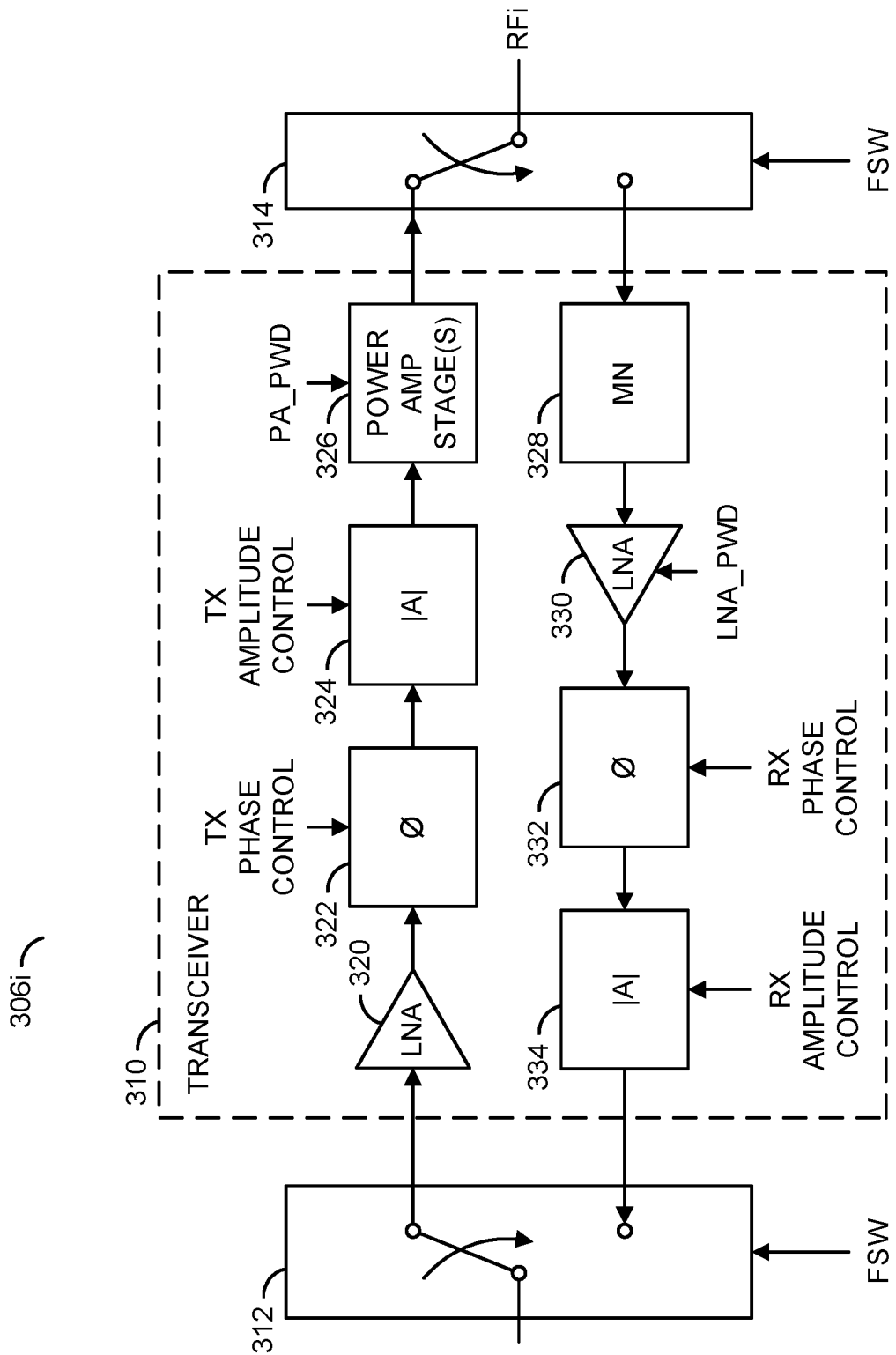
FIG. 10 is a diagram illustrating an example implementation of a transceiver circuit in accordance with an example embodiment of the invention.

Referring to FIG. 10, a diagram of a circuit 306i is shown illustrating an example implementation of a transceiver circuit in accordance with an example embodiment of the invention. In an example, the transceiver circuit 306i may be representative of the single-polarization beam former transceiver circuits (or channels) 306a-306d of FIG. 6. In another example, the transceiver circuit 306i may be representative of similar beam former transceiver circuits implemented in horizontal transceiver circuits and vertical transceiver circuits of the dual-polarization beam former circuits 212a-212m of FIGS. 3 and 5. In an example embodiment, the circuit 306i may comprise a block (or circuit) 310, a block (or circuit) 312, and a block (or circuit) 314. In an example embodiment, the circuit 310 may implement a transceiver circuit. The blocks 312 and 314 may implement hard-wired fast transmit-receive (T/R) switches. A transceiver circuit is generally capable of both transmitting and receiving signals of a communication channel. In various embodiments, the circuit 310 may be capable of transmitting and receiving radio frequency (RF), microwave, and/or millimeter-wave signals.

In various embodiments, the circuit 310 may be representative of transceiver circuits utilized in applications including, but not limited to cellular base stations (e.g., 2G, 3G, 4G, 5G, etc.), wireless communication systems, wireless local area networks (WLANs), wireless backhaul channels, broadband repeaters, community antenna television (CATV) networks, macro cells, micro cells, pico cells, femto cells, mobile devices (MDs), and/or portable handheld devices (UEs). In some embodiments, the circuit 310 may be representative of a radar application including, but not limited to target detection, ranging, and/or through-wall imaging. In an example, the transceiver circuit 310 generally comprises both a transmitter chain and a receiver chain. Both the transmitter chain and the receiver chain may comprise radio frequency (RF) amplifiers.

In an example, the transmitter chain may include an input amplifier 320, a variable (programmable) phase shifter 322, a variable (programmable) attenuator 324, and one or more output amplifier stages 326. In various embodiments, the variable phase shifter 322 and the variable attenuator 324 may be implemented using conventional techniques. In an example, the input amplifier 320 may be implemented as a low noise amplifier (LNA). The output amplifier stages 326 may include drivers, pre-amplifiers, and/or power amplifiers.

In various embodiments, the variable (programmable) phase shifter 322 may receive a signal (e.g., TX PHASE CONTROL), the variable (programmable) attenuator 324 may receive a signal (e.g., TX AMPLITUDE CONTROL), and the one or more output amplifier stages 326 may receive a signal (e.g., PA_PWD) at a respective power down (e.g., PWD) pin. The signal TX PHASE CONTROL may set a phase shift provided by the variable (programmable) phase shifter 322. The signal TX AMPLITUDE CONTROL may set an attenuation provided by the variable (programmable) attenuator 324. The signal PA_PWD generally controls a power down state of one or more of the output amplifier stages 326.

In an example, the signal PA_PWD is generated in response to the signal FSW. In an example, the signal PA_PWD may be generated according to the following TABLE 1:

TABLE 1

| FSW | PA_PWD |
|---|---|
| LOW | LOW |
| HIGH | HIGH |

When the signal FSW is HIGH (or a logic 1), the switches 312 and 314 are in the receive (RX) mode and the signal PA_PWD is HIGH (or a logic 1) to power down the power amplifier stages 326. When the signal FSW is LOW (or a logic 0), the switches 312 and 314 are in the transmit (TX) mode and the signal PA_PWD is LOW (or a logic 0) to power up the power amplifier stages 326.

In an example, the receiver chain may include a limiter (or protection) and filter (MN) circuit 328, a low noise amplifier (LNA) 330, a variable (programmable) phase shifter 332, and a variable (programmable) attenuator 334. In various embodiments, the variable phase shifter 332 and the variable attenuator 334 may be implemented using conventional techniques. In various embodiments, the variable (programmable) phase shifter 332 may receive a signal (e.g., RX PHASE CONTROL), the variable (programmable) attenuator 334 may receive a signal (e.g., RX AMPLITUDE CONTROL), and low noise amplifier (LNA) 330 may receive a signal (e.g., LNA_PWD) at a respective power down (e.g., PWD) pin. The signal RX PHASE CONTROL may set a phase shift provided by the variable (programmable) phase shifter 332. The signal RX AMPLITUDE CONTROL may set an attenuation provided by the variable (programmable) attenuator 334. The signal LNA_PWD generally controls a power down state of the low noise amplifier (LNA) 330.

In an example, the signal LNA_PWD is generated in response to the signal FSW (e.g., by inverting the signal FSW). In an example, the signal LNA_PWD may be generated according to the following TABLE 2:

TABLE 2

| FSW | LNA_PWD |
|------|---------|
| LOW  | HIGH    |
| HIGH | LOW     |

When the signal FSW is HIGH (or a logic 1), the switches 312 and 314 are in the receive (RX) mode and the signal LNA_PWD is LOW (or a logic 0) to power up the low noise amplifier (LNA) 330. When the signal FSW is LOW (or a logic 0), the switches 312 and 314 are in the transmit (TX) mode and the signal LNA_PWD is HIGH (or a logic 1) to power down the low noise amplifier (LNA) 330. The PWD pins of the PA blocks 326 and LNA block 330 generally facilitate rapid switching between TX and RX modes by ensuring the PA and LNA blocks may be totally power downed quickly.

In an example, an input of the transmitter chain and an output of the receiver chain may be coupled to a transmission line or an RF transceiver system by the RF switch 312. In an example, an output of the transmitter chain and an input of the receiver chain may be coupled to a transmission line or an antenna by the RF switch 314. In various embodiments, the circuits 312 and 314 may implement hard-wired fast transmit-receive (T/R) switches. In an example, the circuits 312 and 314 may be implemented similarly to an asymmetrical T/R switch described in U.S. patent application Ser. No. 15/825,736, filed Nov. 29, 2018, which is incorporated by reference in its entirety. In an example, the circuits 312 and 314 may be implemented as a stand alone integrated circuit. In another example, the circuits 312 and 314 may be integrated with the transceiver channel 310 within a beam former integrated circuit.

In an example, the circuits 312 and 314 may have a first (input or TX) port, a second (output or RX) port, and a third (common or TRX) port. In an example, the first port of the circuit 314 may be coupled to an output of the transmit channel, the second port of the circuit 314 that may be coupled to an input of the receive channel, and the common port of the circuit 314 may be coupled to the respective antenna input/output RFi. In another example, the first port of the circuit 312 may be coupled to an output of the receive channel, the second port of the circuit 312 may be coupled to an input of the transmit channel, and the common port of the circuit 312 may be coupled to the circuit 308. Each of the circuits 312 and 314 may also include a control input that may receive the signal FSW. The signal FSW generally implements a control signal for switching between a transmit mode where a signal is directed from the first (TX) port to the common (TRX) port and a receive mode where a signal is directed from the common (TRX) port to the second (RX) port. In an example, the signal FSW may be implemented as summarized in the following TABLE 3:

TABLE 3

| FSW  | TX to TRX      | TRX to RX      |
|------|----------------|----------------|
| HIGH | OFF (isolated) | ON             |
| LOW  | ON             | OFF (isolated) |

The signal FSW may be presented either directly to the circuits 312 and 314 or through a conditioning circuit (e.g., where a clean control signal cannot be guaranteed due to overshoot, undershoot, ringing, etc.).

In an example, each of the circuits 312 and 314 may implement a single-pole double-throw (SPDT) radio frequency (RF) switch. However, embodiments with higher numbers of poles and/or throws may be implemented accordingly to meet design criteria of particular applications.

Figure 11:
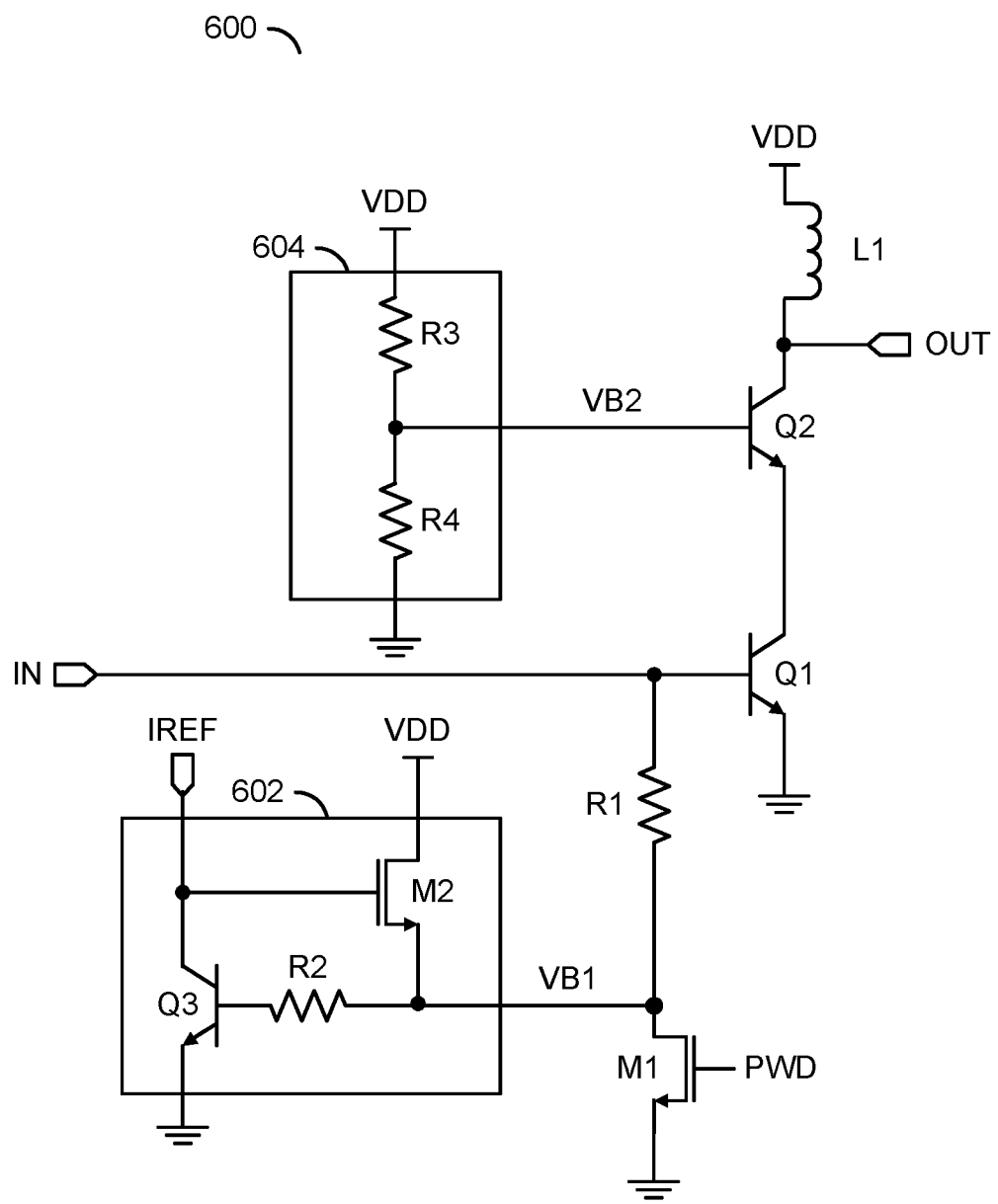
FIG. 11 is a diagram illustrating an example implementation of an amplifier circuit in accordance with an example embodiment of the invention.

Referring to FIG. 11, a diagram of a circuit 600 is shown illustrating an example implementation of an amplifier circuit in accordance with an example embodiment of the invention. In an example, the amplifier circuit 600 may be used to implement one or more of the power amplifier stages 326 and the LNA 330 of FIG. 10. In an example, the circuit 600 may be implemented comprising a cascode single stage power amplifier. In an example, the circuit 600 may be implemented as a single-ended cascode amplifier. In various embodiments, the circuit 600 may be coupled to a first bias circuit 602 and a second bias circuit 604. The first bias circuit 602 may be configured to generate a bias voltage (e.g., VB1) in response to a signal (e.g., IREF) and a power supply voltage (e.g., VDD). The second bias circuit 604 may be configured to generate a bias voltage (e.g., VB2) in response to the power supply voltage (e.g., VDD).

In an example, the power amplifier 600 may comprise a transistor Q1, a transistor Q2, an inductor L1, a resistor R1, and a transistor M1. The transistor M1 may be implemented as a metal-oxide-semiconductor field effect transistor (MOSFET). In an example, each of the transistors Q1 and Q2 may be implemented as a heterojunction bipolar transistor (HBT). However, other types of transistors (e.g., pHEMT, MOSFET, etc.) may be used accordingly to meet the design criteria of a particular implementation.

An emitter terminal of transistor Q1 may be connected to the circuit ground potential. A first terminal of the resistor R1 may be connected to a base terminal of the transistor Q1. A second terminal of the resistor R1 connected to a drain terminal of the transistor M1. A source terminal of the transistor M1 may be connected to the circuit ground potential. A gate terminal of the transistor M1 may be connected to the power down pin PWD. The bias voltage VB1 may be presented to the junction of the second terminal of the resistor R1 and the drain terminal of the transistor M1. A collector terminal of the transistor Q1 may be connected to an emitter terminal of the transistor Q2. The bias voltage VB2 may be presented to a base terminal of the transistor Q2. A collector terminal of the transistor Q2 may be coupled to a first terminal of the inductor L1. A second terminal of the inductor L1 may be coupled to the supply voltage VDD. An input signal IN may be presented to the base terminal of the transistor Q1. An output signal (e.g., OUT) of the amplifier 600 may be presented at a node formed by connection of the collector terminal of the transistor Q2 and the first terminal of the inductor L1.

In an example, the circuit 602 may comprise a metal oxide semiconductor field effect transistor (MOSFET) M2, a bipolar junction transistor Q3, and a resistor R2. A drain terminal of the transistor M2 may be tied to the power supply voltage VDD. The signal IREF may be presented to a node formed by connection of a gate terminal of the transistor M2 and a collector terminal of the transistor Q3. An emitter terminal of the transistor Q3 may be connected to the circuit ground potential. A base terminal of the transistor Q3 may be coupled by the resistor R2 to a source terminal of the transistor M2. The bias voltage VB1 may be presented at a node formed by connection of the source terminal of the transistor M2 and the terminal of the resistor R2. In an example, the transistor Q3 may be implemented as a heterojunction bipolar transistor. In general, the transistors Q1, Q2, and Q3 are implemented using similar types of transistors.

In an example, the circuit 604 may comprise a resistor R3 and a resistor R4. In various embodiments, the circuit 604 provides bias for the cascode node of the power amplifier core 600. A first terminal of the resistor R3 may be tied to the power supply voltage VDD. A second terminal of the resistor R3 may be connected to a first terminal of the resistor R4. A second terminal of the resistor R4 may be connected to the circuit ground potential. The signal VB2 may be presented at a node formed by the connection of the resistor R3 and the resistor R4.

In general, the bias circuit 602 and 604 do not operate quickly due to high impedance nodes presented by current mirrors and bias resistors. To improve shut down time, the transistor M1 is included to ensure the amplifier shuts down quickly by shutting down the bias current provided by the circuit 602. The transistor M1 may be used to ensure rapid shut down for both the RX and TX sides of the beam former transceiver circuits.

Figure 12:
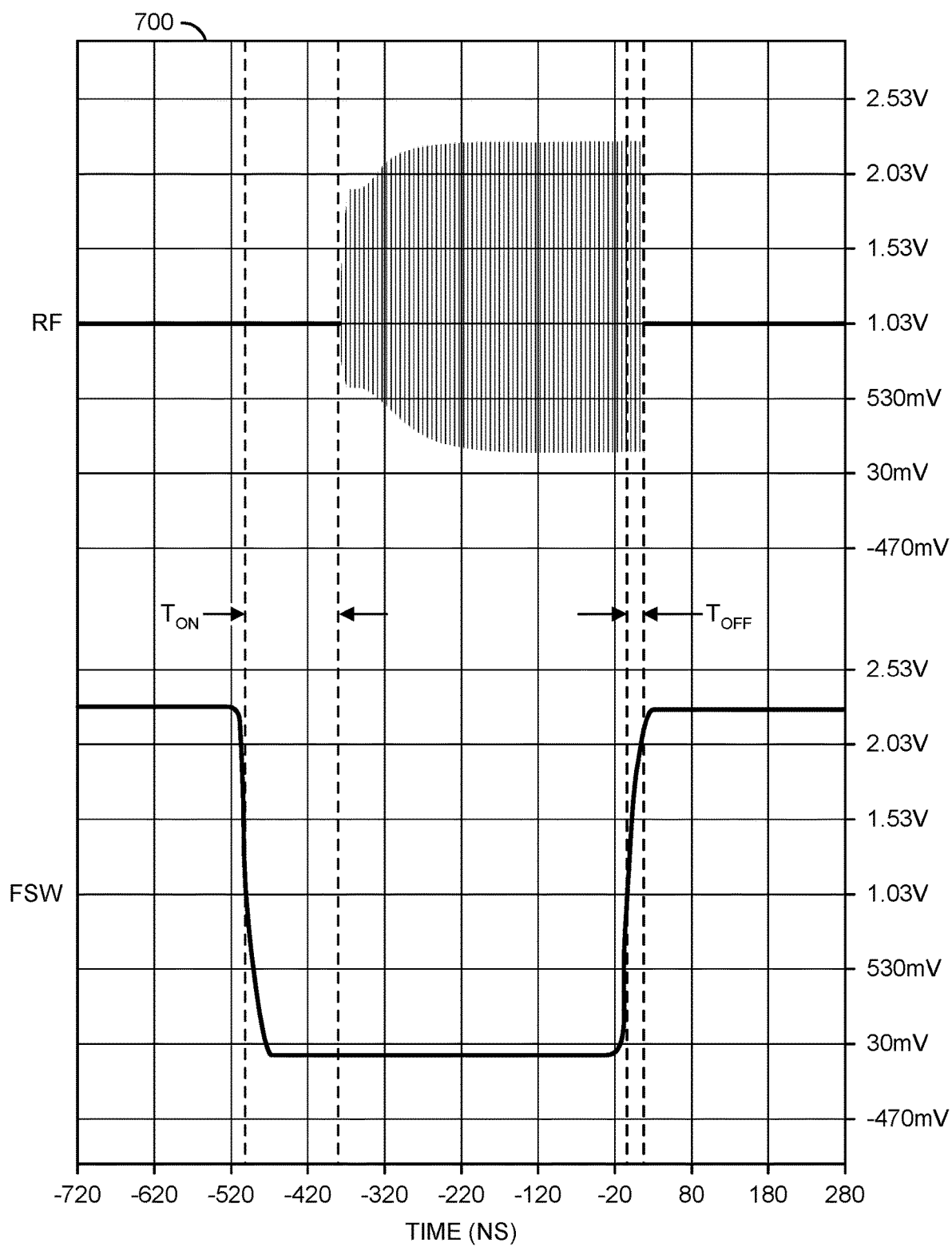
FIG. 12 is a diagram illustrating example switching operations of a transmit-receive (T/R) beam former in accordance with an example embodiment of the invention.

Referring to FIG. 12, a timing diagram 700 is shown illustrating an example fast switching operation of a transmit-receive (T/R) beam former in accordance with an example embodiment of the invention. In an example, when the signal FSW is applied with a LOW (or logic 0) level, the transceiver channel is in the transmit mode and a radio frequency signal is presented at the antenna input/output RF. When the signal FSW switches from the receive-mode-related state (e.g., HIGH) to the transmit-mode-related state (e.g., LOW), a turn on time (e.g., $T_{ON}$) of the transceiver TX channels may be less than or equal to about 130 nanoseconds. When the signal FSW switches from the transmit-mode-related state (e.g., LOW) to the receive-mode-related state (e.g., HIGH), a turn off time (e.g., $T_{OFF}$) of the transceiver TX channels may be less than or equal to about 30 nanoseconds.

Although embodiments of the invention have been described in the context of a RF application, the present invention is not limited to RF applications, but may also be applied in other high data rate wireless and wired communications applications where different rapid switching, multiple channel, and multiple user issues may exist. The present invention addresses concerns related to high speed wireless communications, mobile and stationary transceivers and point-to-point links. Future generations of wireless communications applications using radio frequency (RF), microwave, and millimeter-wave links can be expected to provide increasing speed, increasing flexibility, and increasing numbers of interconnections and layers. The present invention may also be applicable to wireless communications systems implemented in compliance with either existing (legacy, 2G, 3G, 4G, 5G) specifications or future specifications.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

While the invention has been particularly shown and described with reference to embodiments thereof, it will be understood by those skilled in the art that various changes in form and details may be made without departing from the scope of the invention.

The invention claimed is:

1. An apparatus comprising:
   a phased array antenna panel comprising a plurality of antenna elements disposed on a substrate, wherein said plurality of antenna elements are arranged in one or more groups; and
   one or more beam former integrated circuits mounted on the substrate of the phased array antenna panel, each beam former integrated circuit coupled to a respective group of said antenna elements, each beam former integrated circuit comprising a plurality of transceiver channels, each transceiver channel comprising a first single-pole double-throw radio frequency switch, a second single-pole double-throw radio frequency switch, a transmit channel and a receive channel, wherein (i) the phased array antenna panel is configured to distribute a control signal to a dedicated input of each of the beam former integrated circuits, (ii) each of the beam former integrated circuits is configured to distribute the control signal to the first and the second single-pole double-throw radio frequency switches of each of the transceiver channels, and (iii) the first and the second single-pole double-throw radio frequency switches of each of the transceiver channels are configured to switch each transceiver channel between a transmit mode and a receive mode in response to the control signal.

2. The apparatus according to claim 1, wherein each of the beam former integrated circuits comprises a combiner-splitter network coupled to a common radio frequency port.

3. The apparatus according to claim 2, wherein each of the transceiver channels is coupled between the combiner-splitter network and a respective antenna element by the first and the second single-pole double-throw radio frequency switches.

4. The apparatus according to claim 1, wherein each of the transceiver channels comprises one or more amplifier circuits and a bias level of at least one of said amplifier circuits is controlled in response to the control signal.

5. The apparatus according to claim 1, wherein a switching speed and a settling time of the transmit channels and the receive channels is compliant with fifth generation (5G) communication systems.

6. The apparatus according to claim 1, wherein each of the beam former integrated circuits implements a fifth generation (5G) transceiver (TRX) beam former.

7. The apparatus according to claim 1, wherein each beam former integrated circuit further comprises a memory configured to store a plurality of phase, gain, and bias values for each of said transceiver channels, and said memory is configured to rapidly switch between said phase, gain, and bias values for each of said transceiver channels in response to a second control signal.

8. The apparatus according to claim 1, wherein a switching time from said receive mode to said transmit mode is less than about 130 nanoseconds.

9. The apparatus according to claim 1, wherein a switching time from said transmit mode to said receive mode is less than about 30 nanoseconds.

10. A beam former integrated circuit architecture comprising:
    a dedicated transmit-receive control pin configured to receive a transmit-receive control signal;

a combiner-splitter network coupled to a common radio frequency port; and a plurality of transceiver channel circuits, each transceiver channel circuit coupled to said combiner-splitter network by a first single-pole double-throw radio frequency switch and to a respective radio frequency input/output by a second single-pole double-throw radio frequency switch, first and said second single-pole double-throw radio frequency switches are hardwired to receive said transmit- receive control signal enabling each of said transceiver channels to switch rapidly between a transmit mode and a receive mode in response to the transmit-receive control signal.

11. The beam former architecture according to claim 10, further comprising a memory configured to store a plurality of phase, gain and bias values for each of said transceiver channel circuits, wherein said memory is configured to rapidly switch between said phase, gain and bias values for each of said transceiver channel circuits in response to a second control signal.

12. A method of fast transmit-receive switching comprising:

arranging a plurality of antenna elements disposed on a substrate of a phased array antenna panel in one or more groups;

mounting one or more beam former integrated circuits on the substrate of the phased array antenna panel;

coupling each beam former integrated circuit to a respective group of said antenna elements, wherein each beam former integrated circuit comprises a plurality of transceiver channels including a first single-pole double-throw radio frequency switch, a second single-pole double-throw radio frequency switch, a transmit channel and a receive channel, and each transceiver channel is coupled by first single-pole double-throw radio frequency switch to a respective antenna element of the respective group of antenna elements;

distributing a control signal to a dedicated input of each of the beam former integrated circuits, wherein each of the beam former integrated circuits is configured to distribute said control signal to the first and the second single-pole double-throw radio frequency switches of each of the transceiver channels; and switching each of the plurality of transceiver channels between a transmit mode and a receive mode in response to a state of said control signal.

13. The method according to claim 12, wherein each of the beam former integrated circuits further comprises a combiner-splitter network coupled to a common radio frequency port.

14. The method according to claim 13, wherein each of the transceiver channels is coupled between the combiner-splitter network and the respective antenna element by the first and the second single-pole double-throw radio frequency switches.

15. The method according to claim 12, wherein each of the transceiver channels comprises one or more amplifier circuits and a bias level of at least one of said amplifier circuits is controlled in response to the control signal.

16. The method according to claim 12, wherein a switching speed and a settling time of the transmit channels and the receive channels is compliant with fifth generation (5G) communication systems.

17. The method according to claim 12, wherein each of the beam former integrated circuits implements a fifth generation (5G) transceiver (TRX) beam former.

18. The method according to claim 12, wherein each beam former integrated circuit further comprises a memory configured to store a plurality of phase, gain, and bias values for each of said transceiver channels, and said memory is configured to rapidly switch between said phase, gain, and bias values for each of said transceiver channels in response to a second control signal.

19. The method according to claim 12, wherein a switching time from said receive mode to said transmit mode is less than about 130 nanoseconds.

20. The method according to claim 12, wherein a switching time from said transmit mode to said receive mode is less than about 30 nanoseconds.

* * * * *